(12) United States Patent
Yi et al.

(10) Patent No.: US 11,035,551 B2
(45) Date of Patent: Jun. 15, 2021

(54) LOW REFRACTIVE INDEX NEODYMIUM FLUORIDE DOPED POLYCARBONATE

(71) Applicant: Savant Technologies LLC, East Cleveland, OH (US)

(72) Inventors: Qing Yi, Shanghai (CN); Jianmin He, East Cleveland, OH (US); Chuan Lin, Shanghai (CN); Zhiyong Wang, Shanghai (CN); James Edward Murphy, Niskayuna, NY (US); Dengke Cai, Mentor, OH (US); Xiaoyong Wu, Shanghai (CN)

(73) Assignee: Savant Technologies LLC, East Cleveland, CT (US)

( * ) Notice: Subject to any disclaimer, the term of this patent is extended or adjusted under 35 U.S.C. 154(b) by 0 days.

(21) Appl. No.: 16/492,103

(22) PCT Filed: Feb. 28, 2017

(86) PCT No.: PCT/CN2017/075209
§ 371 (c)(1),
(2) Date: Sep. 6, 2019

(87) PCT Pub. No.: WO2018/157288
PCT Pub. Date: Sep. 7, 2018

(65) Prior Publication Data
US 2020/0141560 A1    May 7, 2020

(51) Int. Cl.
*F21V 21/00*    (2006.01)
*F21V 9/08*    (2018.01)
*F21K 9/232*    (2016.01)
*F21Y 115/10*    (2016.01)

(52) U.S. Cl.
CPC ............... *F21V 9/08* (2013.01); *F21K 9/232* (2016.08); *F21Y 2115/10* (2016.08)

(58) Field of Classification Search
CPC ......... F21V 9/08; F21K 9/232; F21Y 2115/10
USPC .................................................. 362/293, 84
See application file for complete search history.

(56) References Cited

U.S. PATENT DOCUMENTS

| 8,704,261 | B2 | 4/2014 | Komatsu | |
| 9,807,945 | B2 | 11/2017 | Usami et al. | |
| 2016/0097497 | A1* | 4/2016 | Benner | H01L 51/5262 313/503 |

(Continued)

FOREIGN PATENT DOCUMENTS

| CN | 103026515 A | 4/2013 |
| CN | 104378970 A | 2/2015 |

(Continued)

OTHER PUBLICATIONS

International Search Report and the Written Opinion of the International Searching Authority from International Appl. No. PCT/CN2017/075209, dated Aug. 2, 2017.

*Primary Examiner* — Laura K Tso
(74) *Attorney, Agent, or Firm* — Wood IP Law

(57) ABSTRACT

An apparatus including at least one light emitting diode (LED) module, configured to generate visible light; and at least one component comprising a compound comprising elements of neodymium fluoride and a dopant to lower a refractive index of the compound as compared to neodymium fluoride, the compound configured with the LED module to provide a desired light spectrum by filtering the visible light generated by the LED module.

20 Claims, 4 Drawing Sheets

(56) References Cited

U.S. PATENT DOCUMENTS

| | | | |
|---|---|---|---|
| 2016/0099141 A1* | 4/2016 | Reisman | F21V 9/08 |
| | | | 313/112 |
| 2017/0261162 A1 | 9/2017 | Cai | |
| 2017/0261181 A1* | 9/2017 | Cai | F21K 9/66 |
| 2017/0336557 A1* | 11/2017 | Fu | G02B 6/0065 |
| 2019/0086038 A1* | 3/2019 | Benner | H01L 27/322 |
| 2019/0211977 A1* | 7/2019 | Benner | F21K 9/66 |

FOREIGN PATENT DOCUMENTS

| | | |
|---|---|---|
| CN | 105720163 A | 6/2016 |
| WO | 2018157288 A1 | 9/2018 |

\* cited by examiner

LOW REFRACTIVE INDEX NEODYMIUM FLUORIDE DOPED POLYCARBONATE

TECHNICAL FIELD

The present invention generally relates to lighting applications and related technologies. More particularly, but not exclusively, this invention relates to low refractive index neodymium fluoride compound dopants for imparting a desired color filtering effect in, for example, an LED or other light apparatus.

BACKGROUND OF THE INVENTION

Neodymium ions (e.g., $Nd^{3+}$) have been used in some materials to filter white light to remove the portion of yellow light, and achieve desired color characteristics of light from a light source such as a light emitting diode (LED) lamp. In some instances, the neodymium ions can be used to enhance, for example, one or more of a color saturation, color contrast, and color fidelity of a light source, as described in patent application US 20150109758 A1. The usual source for providing neodymium ions is via neodymium-doped glass.

While a neodymium doped material may offer some desired light characteristics in some instances, if a neodymium doped-glass were to be included in a polycarbonate, then significant haze may result as compared to a clear glass or a clear polymer lighting component. As such, there exists a desire and need for improved or alternative materials that provided high clarity (i.e., low haze) for lighting products and applications.

SUMMARY OF THE INVENTION

According to an aspect of the present disclosure, an apparatus includes at least one light emitting diode (LED) module, configured to generate a visible light; and at least one component including a compound comprising elements of neodymium, fluorine, and a dopant metal element. The dopant metal element lowers a refractive index of the compound as compared to neodymium fluoride ($NdF_3$). The compound is configured with the LED module to provide a desired light spectrum by filtering the visible light generated by the LED module. In some embodiments, a desired light spectrum may comprise a depression in the yellow region of the visible spectrum (or a notch in a yellow region of the visible spectrum) for light that passes from the LED module through the at least one component.

In some embodiments, the compound includes neodymium ions and fluoride ions. In some embodiments, the compound further includes at least one of yttrium (Y), magnesium (Mg), calcium (Ca), barium (Ba), strontium (Sr), sodium (Na), lithium (Li), aluminum (Al) and manganese (Mn) as the dopant metal element. The dopant metal element may typically be present in an ionic form in the compound.

In one embodiment, the dopant element comprises yttrium (Y), and the concentration of Y in the compound is in a range of about 100 parts per million (ppm) to about 50000 ppm. In some specific instances, the concentration of Y in the compound is in a range of about 900 ppm (wt %) to about 1100 ppm (wt %).

In some embodiments, the compound is doped into a polymeric material such as a polycarbonate material.

BRIEF DESCRIPTION OF THE DRAWINGS

These and other features and aspects of the present disclosure will become better understood when the following detailed description is read with reference to the accompanying drawings, in which like characters represent like parts throughout the drawings, wherein.

DETAILED DESCRIPTION

Figure 1:
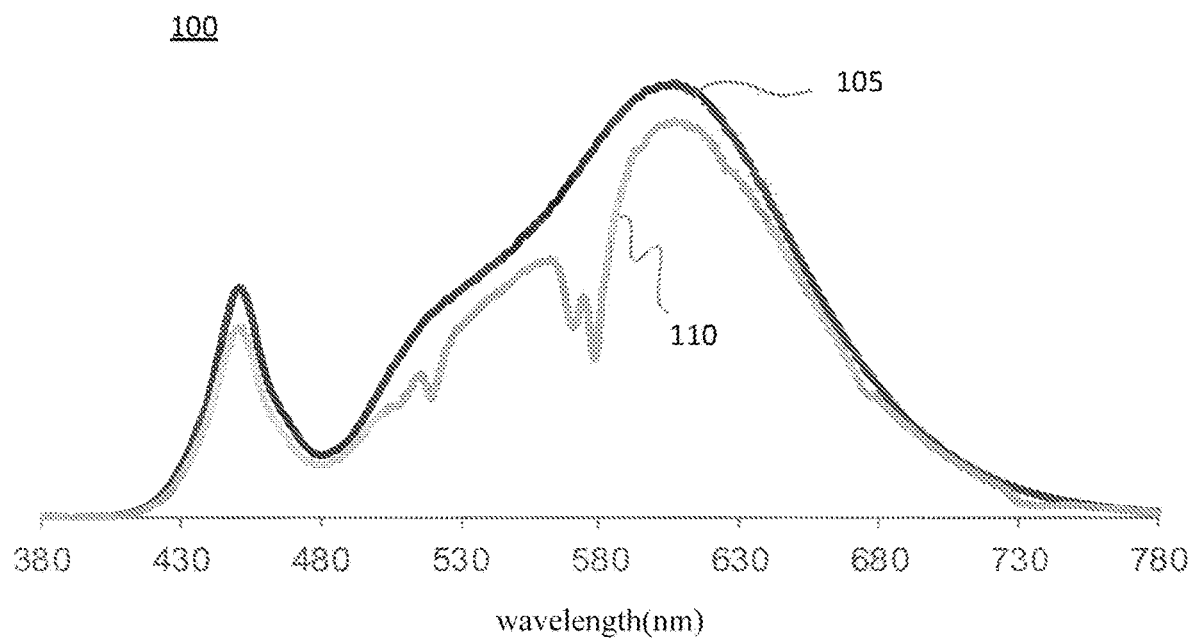
FIG. 1 is a graph comparing absorption of the visible spectrum of light from a lamp and that of the lamp with the light therefrom dispersed through a neodymium-doped polycarbonate material.

The present disclosure relates to neodymium (Nd) materials. Nd ions can be used to modulate the visible light spectrum, such as light emitted from an LED. Neodymium ions ($Nd^{3+}$) can absorb visible light in the range of about (560-630) nanometers (nm), as illustrated in FIG. 1. As further shown in the graph 100 of FIG. 1, peak absorption for Nd of visible light peaks at about 580 nm. A Nd doped polycarbonate material will exhibit similar absorption characteristics in the visible light spectrum and such characteristics can be leveraged in lighting devices, systems, and applications.

Table 1 below shows photometry test results for a bare (LED) lamp and a same type of lamp having a neodymium fluoride doped polycarbonate lens or filter.

TABLE 1

|  | Photometric/lm | Lm Drop | ccx | ccy | CCT/K | CRI | R9 |
| --- | --- | --- | --- | --- | --- | --- | --- |
| Bare Lamp | 1045.00 |  | 0.4369 | 0.402 | 2984 | 82.8 | 12.6 |
| Lamp with NdF3 PC | 830.20 | 79.44% | 0.4446 | 0.3946 | 2797 | 88.8 | 32.8 |

As shown in Table 1, there is a significant decrease in lumens from 1045.00 for the bare lamp versus a value of 830.20 for the lamp having the $NdF_3$ polycarbonate (PC) lens/filter. That is, in Table 1, the lens/filter comprises polycarbonate which includes pure $NdF_3$ that does not contain a further dopant element. The lumens from the $NdF_3$ PC lamp is only about 79.44% of the bare lamp's. Values for chromaticity coordinates (ccx and ccy) and correlated color temperature (cct) are also shown for reference in Table 1. CRI (color rendering index) and R9 (color rending value for the color red) values are also provided for each tested lamp. While the CRI and R9 values may indicate some aspects of improved photometry performance by the $NdF_3$ lamp, the demonstrated drop in lumens may be significant in certain lighting products and applications.

In some aspects, the drop-off in lumens with the NdF₃ lamp used in the example of Table 1 may be attributable to scattering losses of the NdF₃ PC material. As a result, the pure-NdF₃-doped PC may have a large haze and not exhibit good clarity. Some lighting products and applications may call for a device, system, or apparatus having a clear PC lens (e.g., directional LED lamps having a clear lens, some indoor LED fixtures that use a clear light guide, etc.).

High clarity, low haze lighting components (e.g., lenses, light guides, etc.) generally have a fairly close matching of refractive indexes between a matrix material like polycarbonate and the dopant therein. Table 2 below includes a listing of the refractive index (RI) for each of a pure NdF₃ substance and a polycarbonate material. The pure NdF3 powder has a RI of about 1.62 to about 1.63 and the PC material has a RI of about 1.58, where the RI is determined at 656 nm.

TABLE 2

| Substance | RI@656 nm |
|---|---|
| Pure NdF₃ | 1.62~1.63 |
| Polycarbonate | ~1.58 |

While the mismatch (i.e., difference) in refractive indexes for the substances in the example of Table 1 is relatively small, it is sufficient enough such that the PC doped with pure NdF₃ has a high haze. The RI mismatch contributes to scattering losses within the doped material. Table 3 below includes test results for NdF₃ doped PC compound, where it is seen the haze value is 30.

TABLE 3

| Item | Matrix PC | Doping Concentration | Total Transmittance | Haze |
|---|---|---|---|---|
| Result | Teijin LV2225Y | 5 weight % | 76 | 30 |

Some aspects and embodiments herein include a device, system, and apparatus including a lamp (LED) module or device configured to generate a visible light such as white light and at least one component such as an optical component comprising a compound including elements of neodymium, fluorine, and a dopant element, where the dopant elements acts to reduce a refractive index of the compound as compared to the NdF3 alone. The fluorine is generally present in the compound in the form of a fluoride ion.

Table 4 below includes test results for a bare directional lamp (i.e., GE MR16) and the same type of lamp with a NdF₃ PC plate (PC stands for polycarbonate). The test result values in Table 4 indicate the lumens from the lamp with the NdF₃ PC plate is 82.4% of the lumens from the bare lamp (i.e., almost a 20% decrease). However, the MBCP (Maximum Beam Candela Power) for the lamp with the NdF₃ PC plate is only 59.6% of the MBCP value for the bare lamp (i.e., more than a 40% decrease). The lumens change and MBCP changes are not consistent with each other and this is due to the large haze of the NdF₃ doped PC material.

TABLE 4

| Lamp # | Lamp Watts | Lumens | Beam Angle | MBCP | Lumens % | MBCP % |
|---|---|---|---|---|---|---|
| Bare Lamp-GE MR16 | 7.7 | 595.70 | 21.6 | 2579.0 | | |
| Lamp with NdF3 PC plate | 7.7 | 491.08 | 22.9 | 1538.0 | 82.4% | 59.6% |

In some aspects, some decrease in lumens and a corresponding decrease in MBCP performance might be acceptable. However, a disproportionate decrease in MBCP might not be acceptable for one or more lighting products and applications.

In some aspects, decreasing the haze of a material such as the NdF3 doped PC in the Table 4 example may result in a material having similar changes in its lumens and MBCP.

Some aspects and embodiments herein include a low RI NdF3 material that may address the MBCP decrease issue discussed above.

In some aspects, the RI of NdF₃ powder may be reduced when consideration is given to the following relationship:

$$RI = \sqrt{\mu \varepsilon}, \varepsilon \propto \alpha \quad (1)$$

Referring to equation (1), $\mu$ is the magnetic permittivity, $\varepsilon$ represents the dielectric constant, $\alpha$ is the ionic polarization, and the dielectric constant is proportional to the ionic polarization. Accordingly, a material with a lower ionic polarization will have a lower RI.

In some aspects, doping a base material with a dopant having a smaller ionic polarization than the base material might result in a reduction of the RI for a compound including the doped base material. For example, Yttrium (Y), and in particular yttrium ions ($Y^{3+}$), have a smaller ionic polarization than neodymium ions ($Nd^{3+}$) and a same valence as $Nd^{3+}$. Doping $Y^{3+}$ into NdF₃ may have the effect of reducing the RI of the base NdF₃ material.

Table 5 below includes a listing of measured RI test results for pure NdF₃ powder and NdF₃ combined with different concentrations of $Y^{3+}$ ions. As shown in Table 5, the RI for the pure NdF₃ powder is about 1.62 to about 1.63, whereas the RI for the compound including the NdF₃ doped with the $Y^{3+}$ ions decreases as the concentration of $Y^{3+}$ ions increases. That is, as the doping concentration is increased, the RI of the material decreases. The RI is 1.624 for 341 ppm (parts per million) Y (by weight), RI is 1.603 for 622 ppm Y (by weight), and 1.585 for 941 ppm Y (by weight). As used herein, 1 ppm equates to 0.0001 wt %.

TABLE 5

| | Measured RI | | | |
|---|---|---|---|---|
| | 1.62~1.63 | 1.585 | 1.603 | 1.624 |
| ppm Y dopant in NdF3 | 0 | 941 | 622 | 341 |

Referring again to Table 3, it is noted that the RI for a subject pure polycarbonate is about 1.58. In some example embodiments, doping $NdF_3$ with a concentration of 941 ppm Y (by weight) will result in such material having a RI of about 1.585, as indicated in Table 5. Accordingly, some embodiments herein include a PC base material doped with a compound including NdF3 and about 941 ppm Y (by weight).

In some embodiments, the dopant element may include at least one of yttrium (Y), magnesium (Mg), calcium (Ca), Barium (Ba), Strontium (Sr), Sodium (Na), Lithium (Li), Aluminum (Al) and manganese (Mn).

Figure 2:
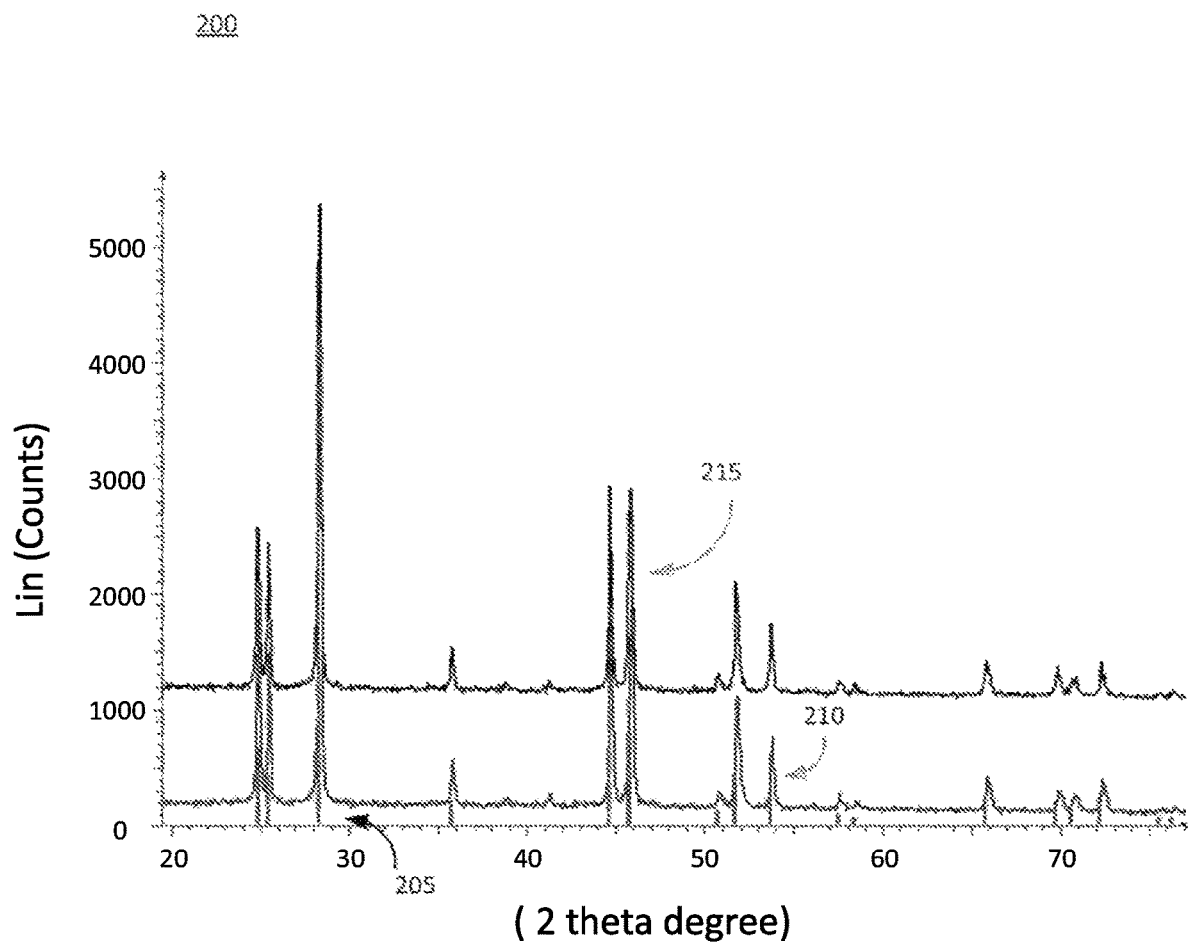
FIG. 2 is a graph illustrating XRD results for pure neodymium fluoride and yttrium doped neodymium fluoride.

FIG. 2 is an example representative graph 200 of X-ray diffraction (XRD) results for pure $NdF_3$ powder and for powder of $NdF_3$ doped with two different concentrations of Y. The traces generally shown at 205 refer to the XRD results for the pure $NdF_3$ powder, while 210 refers to a compound including $NdF_3$ and about 744 ppm Y (by weight) and 215 refers to a compound including $NdF_3$ and about 941 ppm Y (by weight). As seen in FIG. 2, the refractive peaks of the Y doped $NdF_3$ materials are slightly shifted from the pure $NdF_3$ powder but are otherwise consistent with the pure $NdF_3$ powder. This small shift in peaks may be attributed to the Y ions having a slightly smaller diameter than the $NdF_3$ ions. Lack of $2^{nd}$ (secondary) phase peaks in the XRD patterns beyond those belonging to $NdF_3$ suggested that the Y ions are well integrated (i.e., chemically uniformly mixed at an atomic level) into the crystalline structure of the $NdF_3$ powder to form solid solutions and the consistency in the test results is evidence thereof.

In some aspects, FIG. 2 illustrates the change in RI accomplished by doping the $NdF_3$ powder with Y does not alter other characteristics of the $NdF_3$ material.

Figure 3:
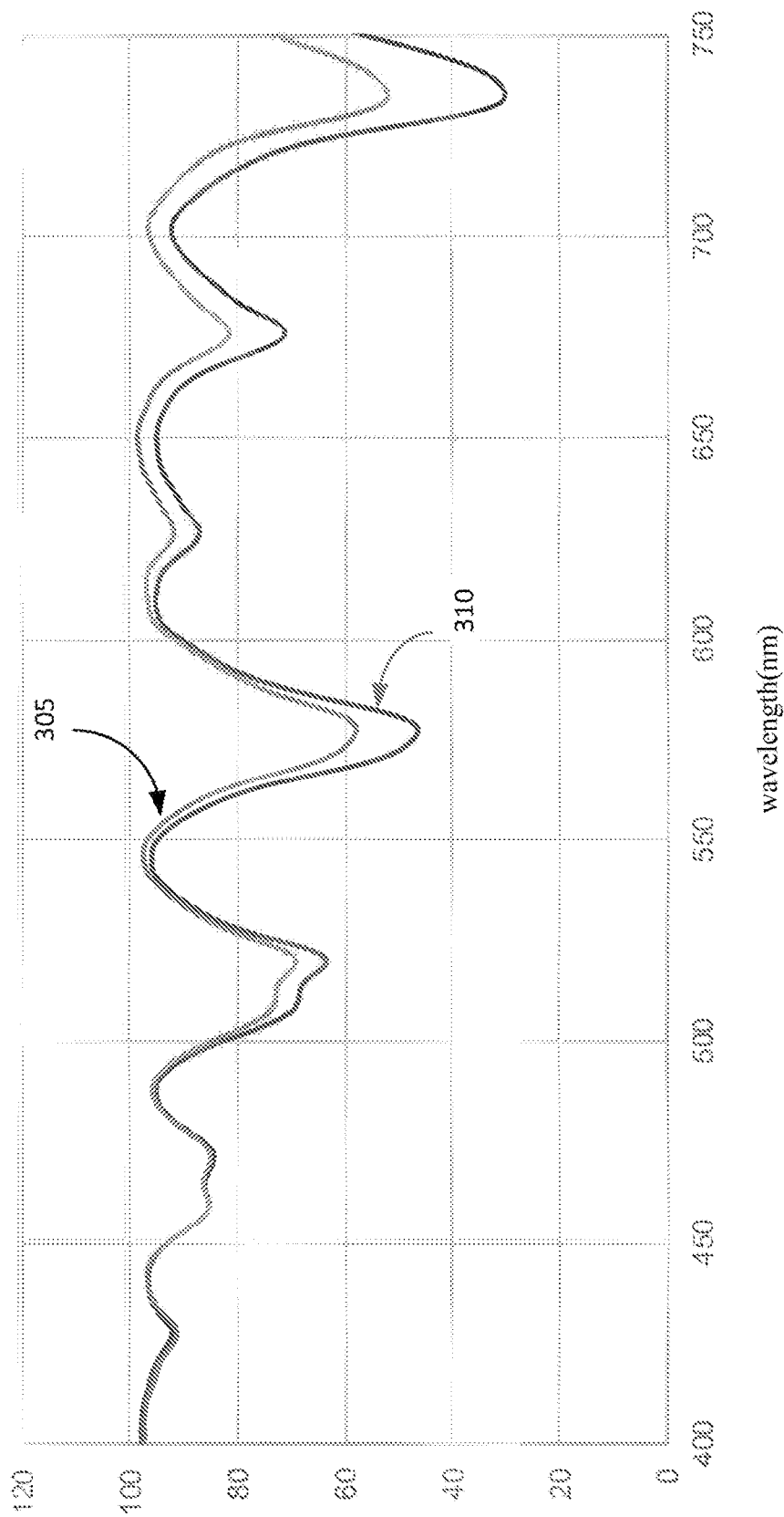
FIG. 3 is a graph comparing absorption of a visible spectrum of light from a lamp with the light therefrom dispersed through a neodymium fluoride glass and yttrium doped neodymium fluoride neodymium polycarbonate material.

FIG. 3 is an example graph 300 of the absorption spectrum of pure $NdF_3$ and $NdF_3$ doped with Y ions, as discussed in some embodiments herein. Graph 305 refers to the pure $NdF_3$, and line 310 references the Y doped $NdF_3$ material. As seen, all of the absorption peaks of the Y-doped $NdF_3$ align with the absorption peaks of the pure $NdF_3$. As such, the color performance of the Y-doped $NdF_3$ material is consistent with the color performance of the pure $NdF_3$, although the Y-doped $NdF_3$ has a lower RI as compared to pure $NdF_3$.

Table 6 includes performance test results for pure $NdF_3$ and $NdF_3$ doped with different concentrations of Y, where the concentrations of Y ions are detailed in the table. Of note, the haze value for the pure $NdF_3$ is 30 and is steadily reduced as the concentration of Y in the doped material increases. The haze value for 332 ppm Y (by weight) and 622 ppm Y (by weight) is 13 but the haze value is reduced to 6 for 941 ppm Y (by weight).

TABLE 6

|  | Pure $NdF_3$ | Y weight % = 941 ppm | Y weight % = 622 ppm | Y weight % = 332 ppm |
|---|---|---|---|---|
| Loading Concentration in PC | 5.00% | 5.00% | 5.00% | 5.00% |
| τt | 76 | 82 | 79 | 79 |
| τd | 23 | 5 | 10 | 10 |
| Haze | 30 | 6 | 13 | 13 |
| Degree of Dispersion | <1 | <1 | <1 | <1 |

Table 7 below includes test results for low haze PC materials including a bare lamp and the same type of lamp having a plate (e.g., a lens or filter) near (e.g., adjacent to, on, or in) the lamp to filter the light from the lamp through the plate. Lamps including four different plates were tested in the example of Table 7. The sample (I) lamp included a plate having $NdF_3$ and 941 ppm Y (by weight), lamp (II) had a plate including $NdF_3$ and 332 ppm Y (by weight), the plate of lamp (III) included pure $NdF_3$, and lamp (IV) was the benchmark/reference of Nd glass having good clarity and low haze.

TABLE 7

| Lamp # | Plate Haze | Lamp Volts | Lamp Watts | Lumens | Beam Angle | MBCP | Lumens % | MBCP % | MBCP %/ Lumens % |
|---|---|---|---|---|---|---|---|---|---|
| Bare |  | 230.05 | 5.23 | 394.91 | 31.4 | 1185.0 |  |  |  |
| (I) 941 ppm Y doped NdF3 | 6 | 230.04 | 5.23 | 343.52 | 31.7 | 978.6 | 87.0% | 82.6% | 94.9% |
| (II) 332 ppm Y doped NdF3 | 13 | 230.05 | 5.24 | 335.44 | 31.8 | 933.9 | 84.9% | 78.8% | 92.8% |
| (III) Pure NdF3 | 30 | 230.05 | 5.24 | 336.75 | 32.3 | 848.7 | 85.3% | 71.6% | 84.0% |
| (IV) Glass- 5%/2 mm | N/A | 230.05 | 5.23 | 300.10 | 31.6 | 877.6 | 76.0% | 74.1% | 97.5% |

Referring to Table 7, it is noted that the correlation between the lumens percentage and the MBCP percentage (MBCP %/Lumens %) for each lamp is listed in the right-most column. For lamp (I), the correlation is very high since the values for its Lumens % (87.0%) and MBCP % (82.6%) are close to each other. The correlation for lamp (I) of 94.9% closely approaches the 97.5% value for the Nd glass of sample lamp (IV). As supported by the values in Table 7, the MBCP decrease is primarily due to the lumens decrease.

Some of the foregoing embodiments herein include a number of different examples of concentrations of Y into $NdF_3$. The examples are illustrative rather than exhaustive. In some embodiments, the dopant is yttrium (Y) and the concentration of Y in a $NdF_3$ is in a range of about 100 parts per million (ppm) to about 50000 ppm. In some specific example embodiments, the concentration of Y in the $NdF_3$ is in a range of about 900 ppm to about 1000 ppm.

Figure 4:
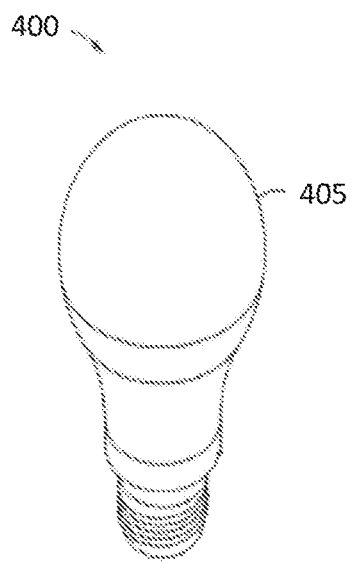
FIG. 4 is an example of a lighting apparatus to emit visible light in a nearly omnidirectional manner.

FIG. 4 is an example of a lighting apparatus 400 to emit visible light in a nearly omnidirectional manner. The enclosure 405 shown in FIG. 1 may be substantially spheroidal or ellipsoidal in shape. To further promote a nearly omnidirectional lighting capability, enclosure 405 may include a material that enables enclosure 405 to function as an optical diffuser. Materials employed to produce the diffuser may include a polycarbonate (PC) doped with a neodymium fluoride compound in accordance with some embodiments disclosed herein. In some embodiments, lamp 400 may be a LED device. In some embodiments, the light generated by lamp 400 may not be emitted in a substantially omnidirectional manner. In some embodiments, a light filtering optical component (e.g., 405) may be integral to lamp 400 or distinct therefrom.

It is to be understood that the foregoing description is intended to illustrate and not to limit the scope of the invention, which is defined by the scope of the appended claims. Other embodiments are within the scope of the following claims. For example, in some embodiments the polycarbonate may be replaced in part in whole by other substantially transparent or translucent polymeric materials such as polyacrylates (e.g., PMMA).

It is noted that various non-limiting embodiments described and claimed herein may be used separately, combined or selectively combined for specific applications.

Further, some of the various features of the above non-limiting embodiments may be used to advantage, without the corresponding use of other described features. The foregoing description should therefore be considered as merely illustrative of the principles, teachings and exemplary embodiments of this invention, and not in limitation thereof.

The invention claimed is:

1. An apparatus comprising:
   at least one light emitting diode (LED) module, configured to generate a visible light; and
   at least one component including a compound comprising elements of neodymium, fluorine, and at least one dopant metal element to lower a refractive index of the compound as compared to neodymium fluoride ($NdF_3$), the compound configured with the LED module to provide a desired light spectrum by filtering the visible light generated by the LED module,
   wherein an X-ray powder diffraction (XRD) pattern for the compound is substantially similar to an XRD pattern for pure neodymium fluoride ($NdF_3$), peaks in the XRD pattern for the compound being consistent with peaks in the neodymium fluoride XRD pattern with a minor peak position shift.

2. The apparatus of claim 1, wherein the compound comprises neodymium and fluoride ions.

3. The apparatus of claim 1, wherein the at least one dopant metal element comprises yttrium (Y), magnesium (Mg), calcium (Ca), barium (Ba), strontium (Sr), sodium (Na), lithium (Li), aluminum (Al) or manganese (Mn).

4. The apparatus of claim 3, wherein the dopant comprises yttrium (Y), and the concentration of Y in the compound is in a range of about 100 parts per million (ppm) to about 50000 ppm.

5. The apparatus of claim 4, wherein the concentration of Y in the compound is in a range of about 900 ppm to about 1100 ppm.

6. The apparatus of claim 1, wherein the compound is doped into or blended with a substantially transparent or translucent polymeric material.

7. The apparatus of claim 6, wherein the substantially transparent or translucent polymeric material comprises polycarbonate.

8. The apparatus of claim 1, wherein the refractive index of the compound is about 1.58 at 656 nanometers (nm).

9. The apparatus of claim 1, wherein the at least one component including only one neodymium fluoride ($NdF_3$) compound having yttrium as a dopant metal element to lower its refractive index as compared to neodymium fluoride ($NdF_3$).

10. The apparatus of claim 1, wherein the at least one component including the compound comprises characteristics of high clarity and low haze.

11. The apparatus of claim 1, wherein the at least one component including the compound has a haze value of about 6.

12. The apparatus of claim 1, wherein the dopant metal element has a lower ionic polarization than neodymium.

13. The apparatus of claim 1, wherein the LED module comprises an inorganic LED or an organic LED.

14. The apparatus of claim 1, wherein the at least one component is an optical component comprising at least one of a transparent, translucent, or reflective lens, filter, or light guide.

15. An optical component including a compound comprising elements of neodymium, fluorine, and at least one dopant metal element, wherein the at least one dopant metal element comprises yttrium (Y), magnesium (Mg), calcium (Ca), barium (Ba), strontium (Sr), sodium (Na), lithium (Li), aluminum (Al) or manganese (Mn); wherein the compound is doped into or blended with a substantially transparent or translucent polymeric material,
   wherein an X-ray powder diffraction (XRD) pattern for the compound is substantially similar to an XRD pattern for pure neodymium fluoride ($NdF_3$), peaks in the XRD pattern for the compound being consistent with peaks in the neodymium fluoride XRD pattern with a minor peak position shift.

16. The optical component of claim 15, wherein the optical component is a lens, a filter, or a light guide which is at least one of transparent, translucent, or reflective.

17. The optical component of claim 15, wherein the substantially transparent or translucent polymeric material comprises a polycarbonate material.

18. An apparatus comprising:
   at least one light emitting diode (LED) module, configured to generate a visible light; and
   at least one component including a compound comprising elements of neodymium, fluorine, and at least one dopant metal element to lower a refractive index of the compound as compared to neodymium fluoride ($NdF_3$), the compound configured with the LED module to provide a desired light spectrum by filtering the visible light generated by the LED module,
   wherein the refractive index of the compound is about 1.58 at 656 nanometers (nm),
   wherein the at least one dopant metal element comprises yttrium (Y), in a range of about 900 ppm to about 1100 ppm,
   wherein the compound is doped into or blended with a substantially transparent or translucent polymeric material that comprises polycarbonate, and
   wherein an X-ray powder diffraction (XRD) pattern for the compound is substantially similar to an XRD pattern for pure neodymium fluoride ($NdF_3$), peaks in the XRD pattern for the compound being consistent with peaks in the neodymium fluoride XRD pattern with a minor peak position shift.

19. The apparatus of claim 18, wherein the at least one component including only one neodymium fluoride ($NdF_3$) compound having yttrium as a dopant metal element to lower its refractive index as compared to neodymium fluoride ($NdF_3$).

20. The apparatus of claim 18, wherein the at least one component including the compound comprises characteristics of high clarity and a haze value of about 6.

\* \* \* \* \*